(12) United States Patent
Sung et al.

(10) Patent No.: US 10,547,282 B2
(45) Date of Patent: Jan. 28, 2020

(54) FILTER INCLUDING BULK ACOUSTIC WAVE RESONATOR

(71) Applicant: SAMSUNG ELECTRO-MECHANICS CO., LTD., Suwon-si (KR)

(72) Inventors: Jung Woo Sung, Suwon-si (KR); Yoon Sok Park, Suwon-si (KR); Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 111 days.

(21) Appl. No.: 15/704,162

(22) Filed: Sep. 14, 2017

(65) Prior Publication Data

US 2018/0123557 A1  May 3, 2018

(30) Foreign Application Priority Data

Oct. 31, 2016 (KR) .................. 10-2016-0143715
Mar. 27, 2017 (KR) .................. 10-2017-0038522

(51) Int. Cl.
| | |
|---|---|
| H03H 9/10 | (2006.01) |
| B81B 7/00 | (2006.01) |
| B81C 1/00 | (2006.01) |
| H01L 21/768 | (2006.01) |
| H03H 9/05 | (2006.01) |

(52) U.S. Cl.
CPC .......... *H03H 9/105* (2013.01); *B81B 7/0064* (2013.01); *B81C 1/00301* (2013.01); *H01L 21/76898* (2013.01); *H03H 9/059* (2013.01); *H03H 9/1014* (2013.01); *H03H 9/1092* (2013.01); *B81B 2207/096* (2013.01); *B81C 2203/0109* (2013.01)

(58) Field of Classification Search
CPC ...... H03H 9/105; H03H 9/1014; H03H 9/059; H03H 9/1092; H03H 9/02094; H03H 9/02015; H01L 21/76898; B81C 1/00301; B81C 2203/0109; B81B 7/0064; B81B 2207/096
USPC .................. 333/133, 187, 188, 193–196
See application file for complete search history.

(56) References Cited

U.S. PATENT DOCUMENTS

| | | | | |
|---|---|---|---|---|
| 5,880,553 | A * | 3/1999 | Okeshi .............. | H03H 9/0514 310/344 |
| 2002/0093096 | A1* | 7/2002 | Tago ................. | B23K 3/0623 257/738 |
| 2007/0008051 | A1* | 1/2007 | Tsuda ................ | H03H 3/08 333/193 |
| 2008/0081398 | A1 | 4/2008 | Lee et al. | |

(Continued)

FOREIGN PATENT DOCUMENTS

| KR | 1999-0015277 U | 5/1999 |
|---|---|---|
| KR | 10-2008-0011676 A | 2/2008 |

*Primary Examiner* — Robert J Pascal
*Assistant Examiner* — Jorge L Salazar, Jr.
(74) *Attorney, Agent, or Firm* — NSIP Law

(57) ABSTRACT

A filter includes a multilayer structure comprising films and forming bulk acoustic wave resonators, a cap accommodating the bulk acoustic wave resonators and bonded to the multilayer structure, a bonding agent disposed in a bonded area between the multilayer structure and the cap and comprising a bonding layer, and a shielding layer disposed on an inner surface of the cap and comprising a same material as at least a portion of the bonding layer.

17 Claims, 3 Drawing Sheets

(56) References Cited

U.S. PATENT DOCUMENTS

2009/0224851 A1     9/2009    Feiertag et al.
2010/0073106 A1*   3/2010    Stuebing ................ H03H 9/542
                                                                          333/187

\* cited by examiner

FILTER INCLUDING BULK ACOUSTIC WAVE RESONATOR

CROSS-REFERENCE TO RELATED APPLICATION(S)

This application claims the benefit under 35 USC § 119(a) of Korean Patent Application No. 10-2016-0143715 filed on Oct. 31, 2016, in the Korean Intellectual Property Office, and Korean Patent Application No. 10-2017-0038522 filed on Mar. 27, 2017, in the Korean Intellectual Property Office, the entire disclosures of which are incorporated herein by reference for all purposes.

BACKGROUND

1. Field

The following description relates to a filter including a bulk acoustic-wave resonator.

2. Description of Related Art

In accordance with the rapid development of many high-functioning technologies, including mobile communications devices, and chemical/biological devices, demand for compact and lightweight filters, oscillators, resonant elements, acoustic resonant mass sensors, and the like, used in the above-mentioned devices has also recently increased.

To implement such compact and lightweight filters, oscillators, resonant elements, acoustic resonant mass sensors, and the like, use of a film bulk acoustic resonator (FBAR) is typical. The film bulk acoustic resonator may be mass-produced at minimal cost and may be very small in size for minimizing overall size of implementation. Further, the film bulk acoustic resonator may implement a high-quality factor Q value, a main property of a filter, may be used even in a micro-frequency band, and may particularly be used in bands up to bands of a personal communications system (PCS) and a digital cordless system (DCS).

Generally, a film bulk acoustic resonator includes a resonating part implemented by sequentially stacking a first electrode, a piezoelectric layer, and a second electrode on a substrate. The film bulk acoustic resonator operates as follows. First, an electric field is induced in the piezoelectric layer by electrical energy applied to the first and second electrodes, and a piezoelectric phenomenon occurs in the piezoelectric layer by the induced electric field. As a result, the resonating part vibrates in a predetermined direction. As a result, a bulk acoustic wave is generated in the same direction as the vibration direction of the resonating part, such that resonance occurs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes a multilayer structure comprising films and forming bulk acoustic wave resonators, a cap accommodating the bulk acoustic wave resonators and bonded to the multilayer structure, a bonding agent disposed in a bonded area between the multilayer structure and the cap and comprising a bonding layer, and a shielding layer disposed on an inner surface of the cap and comprising a same material as at least a portion of the bonding layer.

The shielding layer may include one of gold (Au), copper (Cu), silver (Ag), platinum (Pt), nickel (Ni), and palladium (Pd).

The bonding agent may facilitate eutectic bonding of the multilayer structure and the cap.

The bonding agent may include at least three bonding layers sequentially stacked between the multilayer structure and the cap. The two bonding layers disposed outermost among the at least three bonding layers may include the same material as the shielding layer.

The two bonding layers may include one of gold (Au), copper (Cu), silver (Ag), platinum (Pt), nickel (Ni), and palladium (Pd).

The bonding layer disposed between the two bonding layers may include tin (Sn).

A a distance between the shielding layer of the cap and the multilayer structure may be in a range of 15 μm to 45 μm.

The shielding layer may be configured to reduce electromagnetic interference introduced into the bulk acoustic wave resonators.

The bulk acoustic wave resonators may form a ladder-type filter.

The bulk acoustic wave resonators may form a lattice-type filter.

In one general aspect, a filter includes a multilayer structure comprising films and forming bulk acoustic wave resonators, a cap accommodating the bulk acoustic wave resonators, comprising a hexahedral shape having an open a bottom surface, and bonded to the multilayer structure, and a shielding layer disposed on an inner surface of the cap. A distance between the shielding layer and the multilayer structure is in a range of 15 μm to 45 μm.

The distance between the shielding layer and the multilayer structure may be in a range of 30 μm to 45 μm.

The distance between the shielding layer and the multilayer structure may include a space.

The shielding layer may have a thickness of 0.5 μm to 1 μm.

The shielding layer may include one of gold (Au), copper (Cu), silver (Ag), platinum (Pt), nickel (Ni), and palladium (Pd).

A bonding agent may be disposed in a bonded area between the multilayer structure and the cap and may include a bonding layer.

At least a portion of the bonding layer may include a same material as the shielding layer.

The bonding agent may include at least three bonding layers sequentially stacked between the multilayer structure and the cap. The two bonding layers disposed outermost among the at least three bonding layers may be formed of the same material as the shielding layer.

Other features and aspects will be apparent from the following detailed description, the drawings, and the claims.

BRIEF DESCRIPTION OF THE DRAWINGS

The above and other aspects, features and other advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
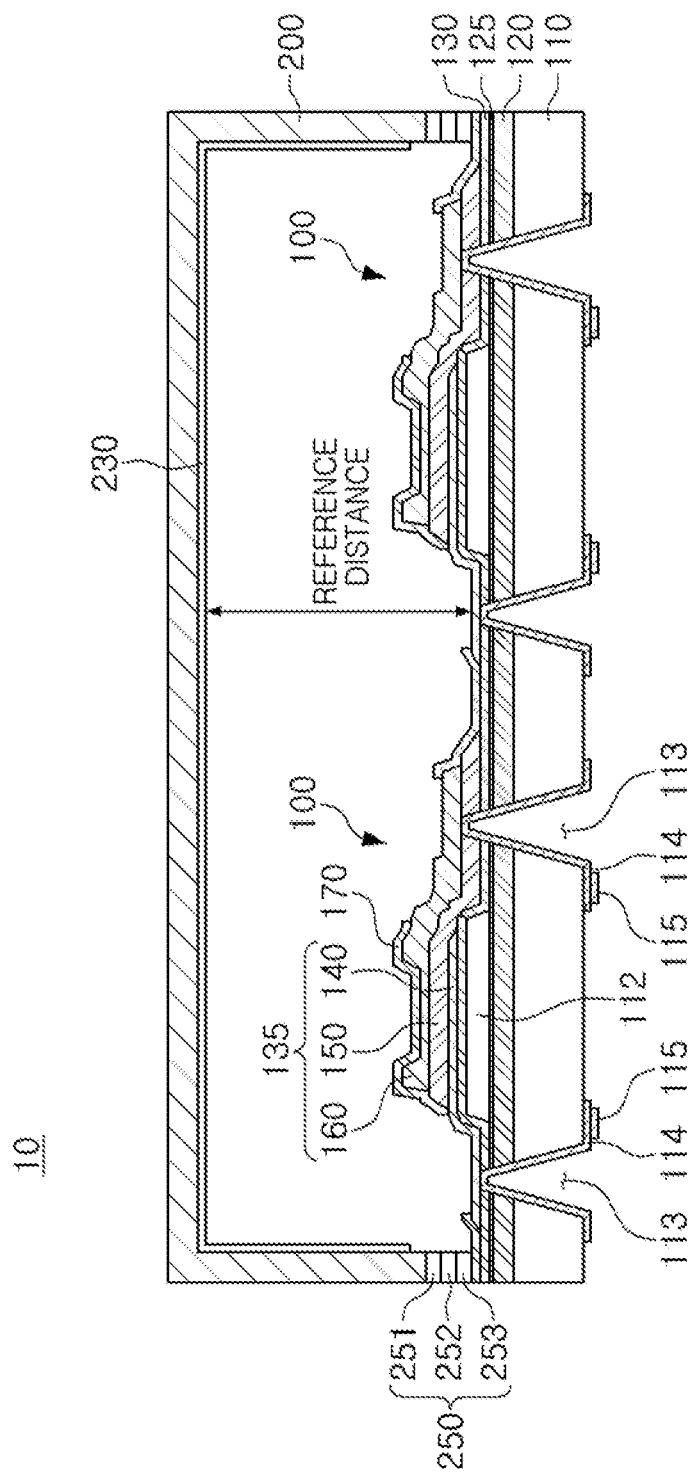
FIG. 1 is a cross-sectional view illustrating an example of a filter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view illustrating an example of a filter.

Referring to FIG. 1, a filter 10 includes bulk acoustic wave resonators 100 and a cap 200. The bulk acoustic wave resonator 100 may be a film bulk acoustic resonator (FBAR).

The bulk acoustic wave resonator 100 is a multilayer structure including a plurality of films. The bulk acoustic-wave resonator 100 includes a substrate 110, an insulating layer 120, an air cavity 112, and a resonating part 135.

The substrate 110 may be formed of silicon. An insulating layer 120 that electrically insulates a resonating part 135 from the substrate 110 may be provided on a top surface of the substrate 110. The insulating layer 120 may be formed on the substrate 110 by performing chemical vapor deposition, RF magnetron sputtering, evaporation, etc., for one of silicon dioxide ($SiO_2$) and aluminum oxide ($Al_2O_2$).

The air cavity 112 is disposed on the insulating layer 120. The air cavity 112 is disposed below the resonating part 135 so that the resonating part 135 may vibrate in a predetermined direction. The air cavity 112 may be formed by forming an air cavity sacrificial layer pattern on the insulating layer 120, forming a membrane 130 on the air cavity sacrificial layer pattern, and then etching and removing the air cavity sacrificial layer pattern. The membrane 130 may serve as an oxidation protective film or serve as a protective layer protecting the substrate 110.

An etching stop layer 125 is formed between the insulating layer 120 and the air cavity 112. The etching stop layer 125 may protect the substrate 110 and the insulating layer 120 from the etching operation and serves as a base on which to deposit various other layers on the etching stop layer 125.

The resonating part 135 includes a first electrode 140, a piezoelectric layer 150, and a second electrode 160 sequentially stacked on the membrane 130. A common region of the first electrode 140, the piezoelectric layer 150, and the second electrode 160 which are overlapped in a vertical direction are disposed above the air cavity 112. The first electrode 140 and the second electrode 160 may be formed of one of gold (Au), titanium (Ti), tantalum (Ta), molybdenum (Mo), ruthenium (Ru), platinum (Pt), tungsten (W), aluminum (Al), iridium (Ir), and nickel (Ni), or alloys thereof.

The piezoelectric layer 150, which is a portion having a piezoelectric effect that converts electrical energy into mechanical energy in a form of elastic wave, may be formed of one of aluminum nitride (AlN), zinc oxide (ZnO), and lead zirconium titanium oxide (PZT; PbZrTiO). In addition, the piezoelectric layer 150 may further include a rare earth metal. As an example, the rare earth metal includes at least one of scandium (Sc), erbium (Er), yttrium (Y), and lanthanum (La). The piezoelectric layer 150 may include the rare earth metal by 1 to 20 at %.

A seed layer for improving crystal orientation of the piezoelectric layer 150 may be additionally disposed below the first electrode 140. The seed layer may be formed of one of aluminum nitride (AlN), zinc oxide (ZnO), and lead zirconium titanium oxide (PZT; PbZrTiO), which have the same crystallinity as the piezoelectric layer 150.

The resonating part 135 may be partitioned into an active area and an inactive area. The active area of the resonating part 135 may refer to an area that vibrates and resonates in a predetermined direction via a piezoelectric phenomenon occurring in the piezoelectric layer 150 when electrical energy, such as a radio frequency signal, is applied to the first electrode 140 and the second electrode 160, and may correspond to an area in which the first electrode 140, the piezoelectric layer 150, and the second electrode 160 overlap in a vertical direction above the air cavity 112. The inactive area of the resonating part 135 may refer to an area that does not resonate by the piezoelectric phenomenon even though the electrical energy is applied to the first electrode 140 and the second electrode 160, and may correspond to an area outside of the active area.

The resonating part 135 may output the radio frequency signal having a specific frequency using the piezoelectric phenomenon. Specifically, the resonating part 135 may output the radio frequency signal having a resonance frequency corresponding to the vibration according to the piezoelectric phenomenon of the piezoelectric layer 150.

The protective layer 170 is disposed on the second electrode 160 of the resonating part 135 to prevent the second electrode 160 from being exposed externally. The protective layer 170 may be formed of one insulating material of silicon oxide based insulating material, silicon nitride based insulating material, and aluminum nitride based insulating material.

At least one via hole 113 penetrating the substrate 110 in a vertical direction of the substrate 110 is formed in a lower surface of the substrate 110. The via hole 113 also penetrates some of the insulating layer 120, the etching stop layer 125, and the membrane 130 in the vertical direction. A connection pattern 114 is formed in the via hole 113, and is formed on an entirety of an inner surface, that is, an inner wall of the via hole 113.

The connection pattern 114 may be manufactured by forming a conductive layer on the inner surface of the via hole 113. For example, the connection pattern 114 may be formed by depositing, coating, or filling at least one conductive metal of gold (Au), copper (Cu), an alloy of titanium (Ti)-copper (Cu) along the inner wall of the via hole 113.

The connection pattern 114 is connected to at least one of the first electrode 140 and the second electrode 160. The connection pattern 114 penetrates at least a portion of the substrate 110, the membrane 130, the first electrode 140, and the piezoelectric layer 150, and is electrically connected to at least one of the first electrode 140 and the second electrode 160. The connection pattern 114 formed on the inner surface of the via hole 113 extends to the lower surface of the substrate 110, and is connected to a substrate connection pad 115 disposed on the lower surface of the substrate 110. Thereby, the connection pattern 114 electrically connects the first electrode 140 and the second electrode 160 to the substrate connection pad 115.

The substrate connection pad 115 may be electrically connected to an external substrate (not shown) disposed below the bulk acoustic wave resonator 100 using a bump. The bulk acoustic wave resonator 100 may perform filtering of the radio frequency signal by the signal applied to the first and second electrodes 140 and 160 through the substrate connection pad 115.

The cap 200 is bonded to the multilayer structure forming the bulk acoustic wave resonators 100 to protect the plurality of bulk acoustic-wave resonators 100 from an external environment. The cap 200 has a cover form including an internal space in which the bulk acoustic wave resonators 100 are accommodated. The cap 200 may be formed in a hexahedral shape of which a bottom surface is opened, and may thus include a top surface and side surfaces.

Specifically, the cap 200 may have an accommodating part formed at the center so as to accommodate the resonating part 135 of the plurality of bulk acoustic-wave resonators 100, and may have a stepped edge as compared to the accommodating part so as to be bonded in a bonding region of the multilayer structure. The bonding region of the multilayer structure may correspond to an edge of the multilayer structure.

Referring to FIG. 1, although the cap 200 is illustrated as being bonded to the protective layer 170 stacked on the substrate 110, the cap 200 may be bonded to at least one of the membrane 130, the etching stop layer 125, the insulating layer 120, and the substrate 110, in addition to or alternatively of the protective layer 170.

The cap 200 may be bonded to the multilayer structure by eutectic bonding. The cap 200 may be bonded to the multilayer structure by pressurizing and heating the multilayer structure and the cap 200 after depositing a bonding agent 250 which may be eutectic-bonded on the multilayer structure.

The bonding agent 250 may be formed of at least one bonding layer to perform the eutectic bonding for the multilayer structure and cap 200. The bonding agent 250 may be provided on a bonded area between the multilayer structure and the cap 200.

The bonding agent 250 includes at least three bonding layers sequentially stacked between the multilayer structure and the cap 200. As an example, the bonding agent 250 includes a first bonding layer 251, a second bonding layer 252, and a third bonding layer 253. The first bonding layer 251 may include one of gold (Au), copper (Cu), silver (Ag), platinum (Pt), nickel (Ni), and palladium (Pd), the second bonding layer 252 may include tin (Sn), and the third bonding layer 253 may include one of gold (Au), copper (Cu), silver (Ag), platinum (Pt), nickel (Ni), and palladium (Pd). The first bonding layer 251 and the third bonding layer 253 may be formed of the same material as each other to enable the eutectic bonding together with the second bonding layer 252.

The shielding layer 230 may be formed along at least one surface of the cap 200. As an example, the shielding layer 230 is formed along an inner surface of the cap 200, and a thickness of the shielding layer 230 may be 0.5 µm to 1 µm.

The shielding layer 230 may include a material capable of performing the eutectic bonding together with tin (Sn). As an example, the shielding layer 230 may include at least one of gold (Au), copper (Cu), silver (Ag), platinum (Pt), nickel (Ni), and palladium (Pd), and the shielding layer 230 may be formed of the same material as the first bonding layer 251 and the third bonding layer 253.

The shielding layer 230 formed of the same material as the first bonding layer 251 and the third bonding layer 253 may be manufactured in the same operation as the first bonding layer 251 and the third bonding layer 253, thereby simplifying the overall manufacturing process.

The shielding layer 230 is spaced apart from the multilayer structure by a reference distance. The reference distance is determined based on the shielding layer 130 provided below a top surface of the cap 200 and a bottom surface of the multilayer structure. Therefore, the reference distance refers to a spaced distance between the shielding layer 230 and the multilayer structure. As an example, the reference distance by which the shielding layer 230 and the multilayer structure are spaced apart from each other may be 15 µm to 45 µm.

Table 1 below is a table illustrating insertion loss according to a thickness of the shielding layer 230 and the reference distance by which the shielding layer 230 and the multilayer structure are spaced apart from each other.

TABLE 1

| | Thickness/ Spaced Distance | Insertion loss [dB] at 1.83 GHz | Insertion loss [dB] at 1.88 GHz | Average Insertion Loss [dB] | Insertion Loss Difference [dB] |
|---|---|---|---|---|---|
| Comparative Example | — | −1.558 | −1.028 | −1.288 | — |
| Inventive Example 1 | 0.5 µm/15 µm | −1.532 | −1.165 | −1.272 | 0.016 |
| Inventive Example 2 | 0.5 µm/30 µm | −1.508 | −1.120 | −1.239 | 0.049 |
| Inventive Example 3 | 0.5 µm/45 µm | −1.497 | −1.039 | −1.228 | 0.060 |
| Inventive Example 4 | 1 µm/45 µm | −1.462 | −1.037 | −1.219 | 0.069 |

Referring to the above Table 1, in the reference distance of 15 µm to 45 µm, the inventive examples 1 to 4 may improve the insertion loss by 0.016 dB to 0.069 dB as compared to the comparative example, thereby improving radio frequency characteristics. In addition, in the reference distance of 30 µm to 45 µm, the inventive examples 2 to 4 may improve the insertion loss by 0.049 dB to 0.069 dB as compared to the comparative example, thereby significantly improving radio frequency characteristics.

Figure 2A:
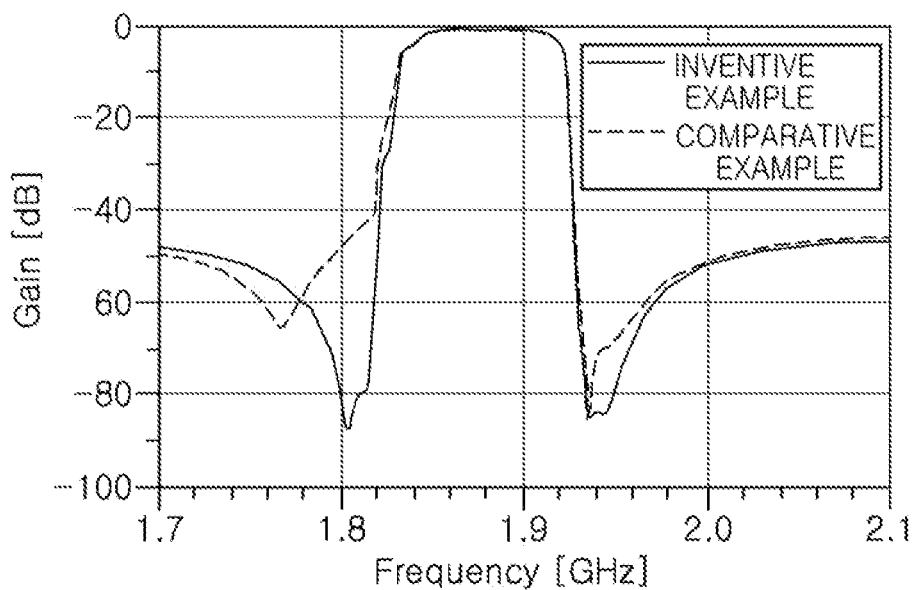
FIGS. 2A and 2B are simulation graphs describing exemplary characteristics of the filter of FIG. 1.
Figure 2B:
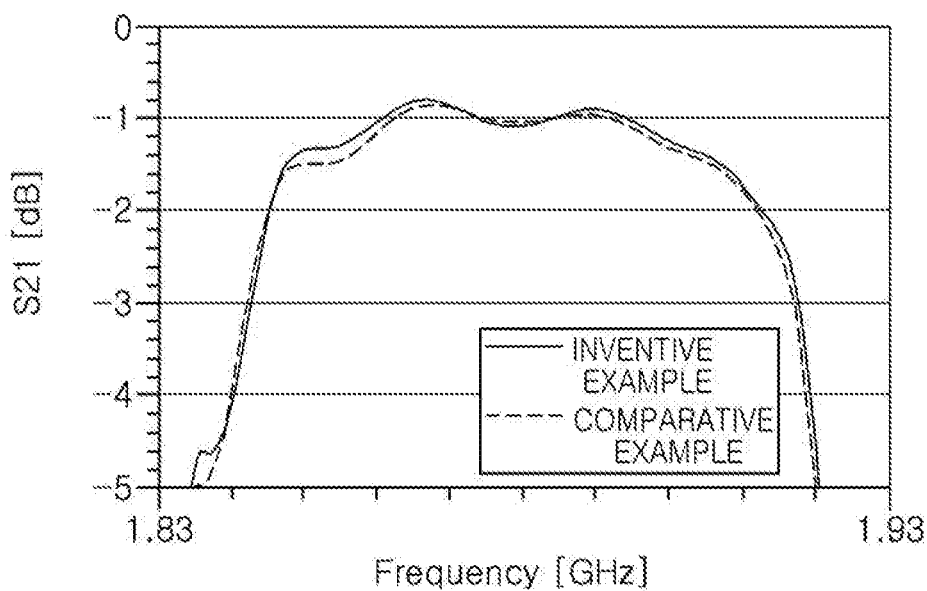

FIGS. 2A and 2B are exemplary simulation graphs according to the device shown in FIG. 1 and described above. FIG. 2A is a graph of a radio frequency signal and FIG. 2B is an enlarged graph of an in-band of the radio frequency signal. In FIGS. 2A and 2B, the comparative example may correspond to a filter in which the shielding layer is not formed on the cap, and the inventive example may correspond to a filter in which the shielding layer is formed on the cap.

When the comparative example and the inventive example are compared with each other with reference to FIG. 2A, it can be seen from the comparative example that a roll-off of a transmission coefficient is deteriorated at about 1.83 GHz. A phenomenon in which the roll-off is deteriorated may be caused by electromagnetic interference to the bulk acoustic-wave resonator. In a case of the example provided in, for example, FIG. 1, the shielding layer may be formed on the cap to exclude the electromagnetic interference, thereby preventing the deterioration of the roll-off.

When the comparative example and the inventive example are compared with each other with reference to FIG. 2B, it may be seen that the graph of the radio frequency signal in the in-band oscillates more in the comparative example than the inventive example. In a case of an example such as the one shown in FIG. 1, the shielding layer may be formed on the cap to suppress the oscillation in the in-band, thereby improving the insertion loss.

Figure 3:
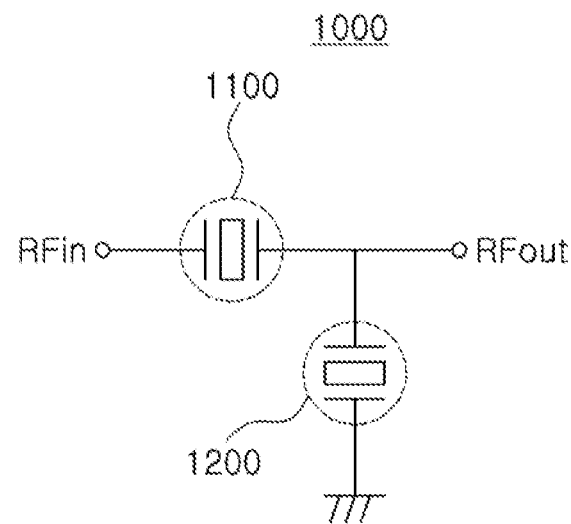
FIGS. 3 and 4 are schematic circuit diagrams illustrating an example of a filter.
Figure 4:
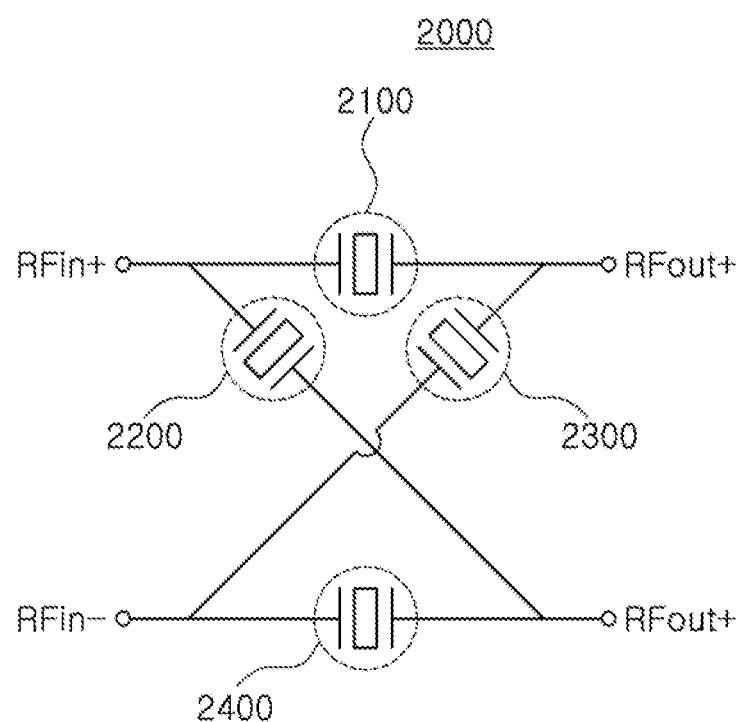

FIGS. 3 and 4 are schematic circuit diagrams of an exemplary filter. Each of a plurality of bulk acoustic wave resonators employed in the filter of FIGS. 3 and 4 may be formed by electrically connecting the bulk acoustic wave resonators according to various examples described above with reference, to FIG. 1, for example.

Referring to FIG. 3, a filter 1000 is formed in a filter structure of a ladder type. Specifically, the filter 1000 may include a plurality of bulk acoustic wave resonators 1100 and 1200.

A first bulk acoustic wave resonator 1100 may be connected in series between a signal input terminal to which an input signal RFin is input and a signal output terminal from which an output signal RFout is output, and a second bulk acoustic-wave resonator 1200 may be connected between the signal output terminal and a ground.

Referring to FIG. 4, a filter 2000 may be formed in a filter structure of a lattice type. Specifically, the filter 2000 may include a plurality of bulk acoustic-wave resonators 2100, 2200, 2300, and 2400 to filter balanced input signals RFin+ and RFin− to output balanced output signals RFout+ and RFout−.

As set forth above, the filter including the bulk acoustic-wave resonator prevents the electromagnetic interference, whereby the deterioration of the roll-off may be prevented and the insertion loss may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter, comprising:
   a multilayer structure comprising films and bulk acoustic wave resonators;
   a cap accommodating the bulk acoustic wave resonators and bonded to the multilayer structure;
   a bonding agent disposed between the multilayer structure and the cap and comprising at least three bonding layers; and
   a shielding layer disposed on an inner surface of the cap and comprising a same material of at least a portion of the bonding layer, wherein the at least three bonding layers are stacked between the multilayer structure and the cap, and two bonding layers of the bonding agent disposed outermost among the at least three bonding layers comprise the same material as the shielding layer.

2. The filter of claim 1, wherein the shielding layer comprises one of gold (Au), copper (Cu), silver (Ag), platinum (Pt), nickel (Ni), and palladium (Pd).

3. The filter of claim 1, wherein the bonding agent facilitates eutectic bonding of the multilayer structure and the cap.

4. The filter of claim 1, wherein the bulk acoustic wave resonators form a lattice-type filter.

5. The filter of claim 1, wherein the two bonding layers comprise one of gold (Au), copper (Cu), silver (Ag), platinum (Pt), nickel (Ni), and palladium (Pd).

6. The filter of claim 1, wherein the bonding layer disposed between the two bonding layers comprises tin (Sn).

7. The filter of claim 1, wherein a distance between the shielding layer of the cap and the multilayer structure is in a range of 15 μm to 45 μm.

8. The filter of claim 1, wherein the shielding layer is configured to reduce electromagnetic interference introduced into the bulk acoustic wave resonators.

9. The filter of claim 1, wherein the bulk acoustic wave resonators form a ladder-type filter.

10. A filter, comprising:
a multilayer structure comprising films and forming bulk acoustic wave resonators;
a cap accommodating the bulk acoustic wave resonators, comprising a hexahedral shape having an open bottom surface, and bonded to the multilayer structure; and
a shielding layer disposed on an inner surface of the cap, wherein a distance between the shielding layer and the multilayer structure is in a range of 15 μm to 45 μm.

11. The filter of claim 10, wherein the distance between the shielding layer and the multilayer structure is in a range of 30 μm to 45 μm.

12. The filter of claim 10, wherein the distance between the shielding layer and the multilayer structure comprises a space.

13. The filter of claim 10, wherein the shielding layer comprises a thickness of 0.5 μm to 1 μm.

14. The filter of claim 10, wherein the shielding layer comprises one of gold (Au), copper (Cu), silver (Ag), platinum (Pt), nickel (Ni), and palladium (Pd).

15. The filter of claim 14, further comprising a bonding agent disposed in a bonded area between the multilayer structure and the cap and comprising a bonding layer.

16. The filter of claim 15, wherein at least a portion of the bonding layer comprises a same material as the shielding layer.

17. The filter of claim 16, wherein the bonding layer comprises at least three bonding layers sequentially stacked between the multilayer structure and the cap, and two bonding layers disposed outermost among the at least three bonding layers comprise of the same material as the shielding layer.

* * * * *